(12) United States Patent
Jung et al.

(10) Patent No.: US 6,416,926 B1
(45) Date of Patent: Jul. 9, 2002

(54) THIABICYCLO COMPOUND, A POLYMER-CONTAINING SAID COMPOUND, AND A PHOTORESIST MICRO PATTERN FORMING METHOD USING THE SAME

(75) Inventors: Jae Chang Jung; Chi Hyeong Roh; Min Ho Jung; Geun Su Lee; Ki Ho Baik, all of Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/630,818

(22) Filed: Aug. 2, 2000

Related U.S. Application Data

(63) Continuation-in-part of application No. 09/311,488, filed on May 13, 1999, now Pat. No. 6,150,069.

(30) Foreign Application Priority Data

May 13, 1998 (KR) ............................................. 98-17211

(51) Int. Cl.$^7$ ................................................ G03F 7/004
(52) U.S. Cl. .................... 430/270.1; 530/326; 526/256; 526/271; 526/281
(58) Field of Search .................. 526/281, 256, 526/271; 430/270.1, 326

(56) References Cited

U.S. PATENT DOCUMENTS 6,150,069 A * 11/2000 Jung et al. ............... 430/270.1

OTHER PUBLICATIONS

Chan–Moon Chung et al., *Reactive & Functional Polymers,* 1977, 40, 1997.

\* cited by examiner

*Primary Examiner*—Rosemary Ashton
(74) *Attorney, Agent, or Firm*—Townsend and Townsend and Crew LLP

(57) ABSTRACT

The present invention provides heterobicyclo compounds of the formula:

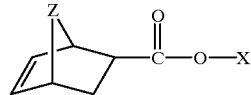

and a method for preparing the same, where Z, X, $R_1$, $R_2$, and m are those defined herein. Compounds of the present invention can be used as monomers for preparing a photoresist resin which is useful, for example, ultra-violet wavelength photolithography processes.

20 Claims, No Drawings

THIABICYCLO COMPOUND, A POLYMER-CONTAINING SAID COMPOUND, AND A PHOTORESIST MICRO PATTERN FORMING METHOD USING THE SAME

CROSS-REFERENCE TO RELATED APPLICATIONS

This application is a continuation-in-part of U.S. patent application Ser. No. 09/311,488, filed May 13, 1999, U.S. Pat. No. 6,150,069 which is incorporated herein by reference in its entirety.

BACKGROUND OF THE INVENTION

The present invention generally relates to an oxabicyclo monomer and a photoresist polymer formed therefrom, a photoresist composition containing said polymer, and a method of forming a photoresist micro pattern using the polymer. During the manufacture of a micro circuit of a highly integrated semiconductor device, the polymer of the present invention can be used as a photoresist in a photoresist lithography process using a KrF(248 nm) or an ArF (193 nm) light source. These are the light sources usually applied in the manufacture of 1G and 4G Dynamic Random Access Memory ("DRAM") semiconductor devices.

In general, an ArF photoresist usually requires excellent etching resistance and adhesiveness as well as low light absorbance at 193 nm wavelength. The ArF photoresist should also be developable by using a 2.38 wt % aqueous tetramethylammonium hydroxide (TMAH) solution. Up to now, many researchers have focused on photoresist resins having an etching resistance and transparency to 193 nm wavelength similar to that of novolac-type resins. This work is described, for example, in the following articles: "Synthesis and Dissolution Characteristics of Novel Alicyclic Polymers With Monoacid Ester Structures" (Takashi Hattori et al., *Journal of Photopolymer Science and Technology*, 1997, Vol. 10, No. 4, pp. 535–544.), "New Protective Groups in Alicyclic Methacrylate Polymers for 193 nm Resists" (Ibid., pp. 545–550), and "Chemically Amplified Resist Based on High Etch-Resistant Polymers for 193 nm Lithography" (Ibid., pp. 561–570) and so on. To obtain an etching resistance similar to that of a novolac-type resin, an ArF photoresist resin should contain an alicyclic group. However, alicyclic-type resins generally have poor adhesiveness. A micro pattern using an alicyclic-type resin is illustrated in FIG. 1. The alicyclic-type resin used to form the pattern in FIG. 1 has good resolution, but poor adhesiveness. Thus, a pattern collapse occurs such as that shown in FIG. 1. As a result, it is very difficult to practically apply such a resist to a semiconductor device.

The photosensitive properties of the photoresist resin are affected by the monomer type used to form the photoresist resin. Thus, photosensitivity, etching resistance, adhesiveness, resolution, and so on varies depending on the monomer type introduced into the photoresist resin. In addition, the monomers conventionally used to form the photoresist resin are expensive, thus making it difficult to mass-produce the photoresist resin using conventional monomers. Therefore, the invention of a monomer which would allow the mass-production of a photoresist resin having excellent photosensitive properties, is advantageous.

SUMMARY OF THE INVENTION

In accordance with the present invention, it has been found that when a heterobicyclic compound, which contains an alicyclic group, is used as a monomer to form an ArF or a KrF photoresist resin polymer, the etching resistance is excellent, the pattern collapse of FIG. 1 can be prevented because of the excellent adhesiveness of the photoresist, and the photoresist resin can be mass-produced economically because the monomer is inexpensive.

Heterobicyclic compounds of the present invention are represented by the following formula:

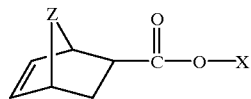

where

Z is O or S;

X is a moiety of the formula:

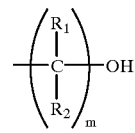

each of $R_1$ and $R_2$ is independently hydrogen or a $C_1$–$C_4$ substituted or unsubstituted straight or branched chain alkyl group; and m is an integer from 1 to 4.

The present invention also relates to a method of preparing the above described heterobicyclic compound.

Preferably, X is 2-hydroxy ethyl, 2-hydroxy propyl, 3-hydroxy propyl, 2-hydroxy butyl, 3-hydroxy butyl, 4-hydroxy butyl, or 2-methyl-3-hydroxy propyl In another embodiment, the present invention provides a polymer derived from a monomer comprising the compound of formula 1. The monomer can further comprise one or more of the compounds selected from the group consisting of t-butyl 5-norbornene-2-carboxylate and compounds of the formula:

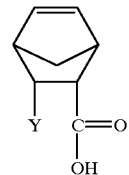

where Y is hydrogen or a carboxylic acid group. In addition, the monomer can include maleic anhydride. Furthermore, the monomer can include tert-butyl 5-norbornene-2-carboxylate.

Polymers of the present invention which is derived from a monomer comprising the heterobicyclic compound of the above Formula 1 include polymers of the formula:

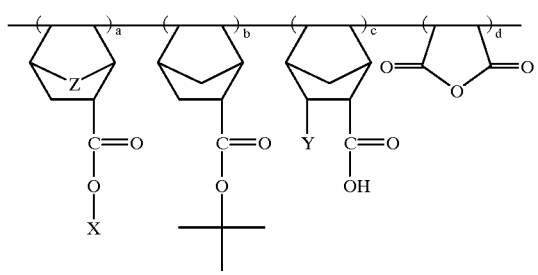

where X and Z are those defined above; Y is a hydrogen or a carboxylic acid group; and a, b, c, and d are relative ratio of each monomeric units. It should be appreciated that the order of each monomeric units represented in a polymer formula of the present invention does not necessarily indicate the actual order of such monomeric units in the actual polymer. The monomeric units represented in the polymer formula is simply intended to indicate the presence of such monomeric unit in the polymer, i.e., when the variable a, b, c, or d is not 0. Moreover, the variables a, b, c, and d represent the total relative ratio of each units. For example, the total amount "d" of polymeric units derived from maleic anhydride may be inter dispersed throughout the polymer (not necessarily in same concentrations) or all or majority of such polymeric unit may be concentrated in one particular location of the polymer. Preferably, the ratio of a:b:c:d is (5–90%):(10–90%): (0–50%):(50–120%). The present invention also relates to a method of preparing the above polymer.

Furthermore, the present invention relates to a photoresist composition comprising a polymer of Formula 2, a photo acid generator, and an organic solvent.

The present invention also relates to a semiconductor device manufactured by using the above photoresist solution, and a method of forming an ArF or a KrF photoresist pattern in the manufacture of such a semiconductor device.

BRIEF DESCRIPTION OF THE DRAWINGS

FIG. 1 is a photograph showing a micro pattern using a conventional ArF photoresist resin.

FIGS. 2 to 17 are photographs showing the micro patterns formed in Examples 1 to 16, respectively. The micro patterns were formed by using an ArF or a KrF photoresist resin containing a polymer derived from a monomer comprising a heterobicyclic monomer, according to the present invention.

DETAILED DESCRIPTION

The present invention is explained more specifically in the following detailed description.

In one embodiment of the present invention, the heterobicyclic compound is an oxabicyclo compound (i.e., Z is O of formula 1). Preferred oxabicyclic compounds include 2-hydroxy ethyl oxabicyclo[2,2,1]hept-5-ene-2-carboxylate; 3-hydroxy propyl oxabicyclo[2,2,1]hept-5-ene-2-carboxylate; 2-hydroxy propyl oxabicyclo[2,2,1]hept-5-ene-2-carboxylate; 4-hydroxy butyl oxabicyclo[2,2,1]hept-5-ene-2-carboxylate; 3-hydroxy butyl oxabicyclo[2,2,1]hept-5-ene-2-carboxylate; 2-hydroxy butyl oxabicyclo[2,2,1] hept-5-ene-2-carboxylate; and 2-methyl-3-hydroxy propyl oxabicyclo[2,2,1]hept-5-ene-2-carboxylate.

In another embodiment of the present invention, the heterobicyclic compound is a thiabicyclic compound (i.e., Z is S of formula 1). Preferred thiabicyclic compounds include 2-hydroxy ethyl thiabicyclo[2,2,1]hept-5-ene-2-carboxylate; 3-hydroxy propyl thiabicyclo[2,2,1]hept-5-ene-2-carboxylate; 2-hydroxy propyl thiabicyclo[2,2,1] hept-5-ene-2-carboxylate; 4-hydroxy butyl thiabicyclo[2,2,1]hept-5-ene-2-carboxylate; 3-hydroxy butyl thiabicyclo[2,2,1]hept-5-ene-2-carboxylate; 2-hydroxy butyl thiabicyclo [2,2,1]hept-5-ene-2-carboxylate; and 2-methyl-3-hydroxy propyl thiabicyclo[2,2,1]hept-5-ene-2-carboxylate.

According to the present invention, the heterobicyclic compound of Formula 1 can be prepared by reacting furan (for Z═O) or thiofuran (for Z═S) with an hydroxy acrylate, preferably in the presence of an organic solvent. Examples of hydroxy acrylates which are useful in the present invention include 2-hydroxy ethyl acrylate, 3-hydroxy propyl acrylate, 2-hydroxy propyl acrylate, 4-hydroxy butyl acrylate, 3-hydroxy butyl acrylate, 2-hydroxy butyl acrylate, 2-methyl-3-hydroxy propyl acrylate, and the like. Preferably, the hydroxy alkyl acrylate is used in a mole ratio of 1:1.5 on the basis of the amount of furan or thiofuran used.

Any organic solvent which is relatively non-reactive can be used in preparation of heterobicyclic compounds of the present invention. Exemplary organic solvents which are useful in the preparation of heterobicyclic compound of formula 1 include, but are not limited to, toluene, tetrahydrofuran, ethyl ether, benzene, dichloromethane, chloroform, and the like. The amount of organic solvent used in the preparation of heterobicyclic compound of formula 1 generally ranges from a weight ratio of 200 to 800 on the basis of the theoretical yield of the compound of Formula 1.

In one particular embodiment of the present invention, polymers of Formula 2 above can be prepared by admixing (i) a heterobicyclic compound of Formula 1 above; (ii) a polymerization initiator; and (iii) maleic anhydride, represented by Formula 6:

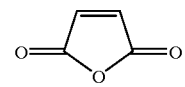

under conditions sufficient to produce the polymer of formula 2.

In another embodiment, the admixture above can further comprise one or more of the compounds selected for the group consisting of (iv) t-butyl-5-norbornene-2-carboxylate of the formula:

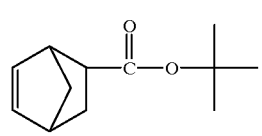

and (v) compounds of the formula:

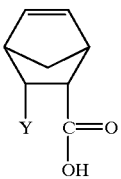

(5a)

where Y is hydrogen or a carboxylic acid group. Exemplary compounds of Formula 5a include 5-norbornene-2-carboxylic acid, represented by the following Formula 4, and 5-norbornene-2,3-dicarboxylic acid, represented by the following Formula 5.

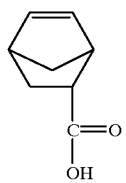

(4)

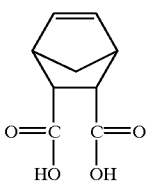

(5)

Exemplary polymers of the present invention include, but are not limited to:

poly(2-hydroxyethyl oxabicyclo[2,2,1]hept-5-ene-2-carboxylate/t-butyl 5-norbornene-2-carboxylate/5-norbornene-2-carboxylic acid/maleic anhydride) polymer;

poly(3-hydroxypropyl oxabicyclo[2,2,1]hept-5-ene-2-carboxylate/t-butyl 5-norbornene-2-carboxylate/5-norbornene-2-carboxylic acid/maleic anhydride) polymer;

poly(2-hydroxypropyl oxabicyclo[2,2,1]hept-5-ene-2-carboxylate/t-butyl 5-norbornene-2-carboxylate/5-norbornene-2-carboxylic acid/maleic anhydride) polymer;

poly(4-hydroxybutyl oxabicyclo[2,2,1]hept-5-ene-2-carboxylate/t-butyl 5-norbornene-2-carboxylate/5-norbornene-2-carboxylic acid/maleic anhydride) polymer;

poly(3-hydroxybutyl oxabicyclo[2,2,1]hept-5-ene-2-carboxylate/t-butyl 5-norbornene-2-carboxylate/5-norbornene-2-carboxylic acid/maleic anhydride) polymer;

poly(2-hydroxybutyl oxabicyclo[2,2,1]hept-5-ene-2-carboxylate/t-butyl 5-norbornene-2-carboxylate/5-norbornene-2-carboxylic acid/maleic anhydride) polymer;

poly(2-methyl-3-hydroxypropyl oxabicyclo[2,2,1]hept-5-ene-2-carboxylate/t-butyl 5-norbornene-2-carboxylate/5-norbornene-2-carboxylic acid/maleic anhydride) polymer;

poly(2-hydroxyethyl oxabicyclo[2,2,1]hept-5-ene-2-carboxylate/t-butyl 5-norbornene-2-carboxylate/5-norbornene-2,3-dicarboxylic acid/maleic anhydride) polymer;

poly(3-hydroxypropyl oxabicyclo[2,2,1]hept-5-ene-2-carboxylate/t-butyl 5-norbornene-2-carboxylate/5-norbornene-2,3-dicarboxylic acid/maleic anhydride) polymer;

poly(2-hydroxypropyl oxabicyclo[2,2,1]hept-5-ene-2-carboxylate/t-butyl 5-norbornene-2-carboxylate/5-norbornene-2,3-dicarboxylic acid/maleic anhydride) polymer;

poly(4-hydroxybutyl oxabicyclo[2,2,1]hept-5-ene-2-carboxylate/t-butyl 5-norbornene-2-carboxylate/5-norbornene-2,3-dicarboxylic acid/maleic anhydride) polymer;

poly(3-hydroxybutyl oxabicyclo[2,2,1]hept-5-ene-2-carboxylate/t-butyl 5-norbornene-2-carboxylate/5-norbornene-2,3-dicarboxylic acid/maleic anhydride) polymer;

poly(2-hydroxybutyl oxabicyclo[2,2,1]hept-5-ene-2-carboxylate/t-butyl 5-norbornene-2-carboxylate/5-norbornene-2,3-dicarboxylic acid/maleic anhydride) polymer;

poly(2-methyl-3-hydroxypropyl oxabicyclo[2,2,1]hept-5-ene-2-carboxylate/t-butyl 5-norbornene-2-carboxylate/5-norbornene-2,3-dicarboxylic acid/maleic anhydride) polymer;

poly(2-hydroxyethyl oxabicyclo[2,2,1]hept-5-ene-2-carboxylate/t-butyl 5-norbornene-2-carboxylate/maleic anhydride) polymer;

poly(3-hydroxypropyl oxabicyclo[2,2,1]hept-5-ene-2-carboxylate/t-butyl 5-norbornene-2-carboxylate/maleic anhydride) polymer;

poly(2-hydroxypropyl oxabicyclo[2,2,1]hept-5-ene-2-carboxylate/t-butyl 5-norbornene-2-carboxylate/maleic anhydride) polymer;

poly(2-hydroxypropyl oxabicyclo[2,2,1]hept-5-ene-2-carboxylate/t-butyl 5-norbornene-2-carboxylate/maleic anhydride) polymer;

poly(4-hydroxybutyl oxabicyclo[2,2,1]hept-5-ene-2-carboxylate/t-butyl 5-norbornene-2-carboxylate/maleic anhydride) polymer;

poly(3-hydroxybutyl oxabicyclo[2,2,1]hept-5-ene-2-carboxylate/t-butyl 5-norbornene-2-carboxylate/maleic anhydride) polymer;

poly(3-hydroxybutyl oxabicyclo[2,2,1]hept-5-ene-2-carboxylate/t-butyl 5-norbornene-2-carboxylate/maleic anhydride) polymer;

poly(2-hydroxybutyl oxabicyclo[2,2,1]hept-5-ene-2-carboxylate/t-butyl 5-norbornene-2-carboxylate/maleic anhydride) polymer;

poly(2-methyl-3-hydroxypropyl oxabicyclo[2,2,1]hept-5-ene-2-carboxylate/t-butyl 5-norbornene-2-carboxylate/maleic anhydride) polymer;

poly(2-hydroxyethyl thiabicyclo[2,2,1]hept-5-ene-2-carboxylate/t-butyl 5-norbornene-2-carboxylate/5-norbornene-2-carboxylic acid/maleic anhydride) polymer;

poly(3-hydroxypropyl thiabicyclo[2,2,1]hept-5-ene-2-carboxylate/t-butyl 5-norbornene-2-carboxylate/5-norbornene-2-carboxylic acid/maleic anhydride) polymer;

poly(2-hydroxypropyl thiabicyclo[2,2,1]hept-5-ene-2-carboxylate/t-butyl 5-norbornene-2-carboxylate/5-norbornene-2-carboxylic acid/maleic anhydride) polymer;

poly(4-hydroxybutyl thiabicyclo[2,2,1]hept-5-ene-2-carboxylate/t-butyl 5-norbornene-2-carboxylate/5-norbornene-2-carboxylic acid/maleic anhydride) polymer;

poly(3-hydroxybutyl thiabicyclo[2,2,1]hept-5-ene-2-carboxylate/t-butyl 5-norbornene-2-carboxylate/5-norbornene-2-carboxylic acid/maleic anhydride) polymer;

poly(2-hydroxybutyl thiabicyclo[2,2,1]hept-5-ene-2-carboxylate/t-butyl 5-norbornene-2-carboxylate/5-norbornene-2-carboxylic acid/maleic anhydride) polymer;

poly(2-methyl-3-hydroxypropyl thiabicyclo[2,2,1]hept-5-ene-2-carboxylate/t-butyl 5-norbornene-2-carboxylate/5-norbornene-2-carboxylic acid/maleic anhydride) polymer;

poly(2-hydroxyethyl thiabicyclo[2,2,1]hept-5-ene-2-carboxylate/t-butyl 5-norbornene-2-carboxylate/5-norbornene-2,3-dicarboxylic acid/maleic anhydride) polymer;

poly(3-hydroxypropyl thiabicyclo[2,2,1]hept-5-ene-2-carboxylate/t-butyl 5-norbornene-2-carboxylate/5-norbornene-2,3-dicarboxylic acid/maleic anhydride) polymer;

poly(2-hydroxypropyl thiabicyclo[2,2,1]hept-5-ene-2-carboxylate/t-butyl 5-norbornene-2-carboxylate/5-norbornene-2,3-dicarboxylic acid/maleic anhydride) polymer;

poly(4-hydroxybutyl thiabicyclo[2,2,1]hept-5-ene-2-carboxylate/t-butyl 5-norbornene-2-carboxylate/5-norbornene-2,3-dicarboxylic acid/maleic anhydride) polymer;

poly(3-hydroxybutyl thiabicyclo[2,2,1]hept-5-ene-2-carboxylate/t-butyl 5-norbornene-2-carboxylate/5-norbornene-2,3-dicarboxylic acid/maleic anhydride) polymer;

poly(2-hydroxybutyl thiabicyclo[2,2,1]hept-5-ene-2-carboxylate/t-butyl 5-norbornene-2-carboxylate/5-norbornene-2,3-dicarboxylic acid/maleic anhydride) polymer;

poly(2-methyl-3-hydroxypropyl thiabicyclo[2,2,1]hept-5-ene-2-carboxylate/t-butyl 5-norbornene-2-carboxylate/5-norbornene-2,3-dicarboxylic acid/maleic anhydride) polymer;

poly(2-hydroxyethyl thiabicyclo[2,2,1]hept-5-ene-2-carboxylate/t-butyl 5-norbornene-2-carboxylate/maleic anhydride) polymer;

poly(3-hydroxypropyl thiabicyclo[2,2,1]hept-5-ene-2-carboxylate/t-butyl 5-norbornene-2-carboxylate/maleic anhydride) polymer;

poly(2-hydroxypropyl thiabicyclo[2,2,1]hept-5-ene-2-carboxylate/t-butyl 5-norbornene-2-carboxylate/maleic anhydride) polymer;

poly(2-hydroxypropyl thiabicyclo[2,2,1]hept-5-ene-2-carboxylate/t-butyl 5-norbornene-2-carboxylate/maleic anhydride) polymer;

poly(4-hydroxybutyl thiabicyclo[2,2,1]hept-5-ene-2-carboxylate/t-butyl 5-norbornene-2-carboxylate/maleic anhydride) polymer;

poly(3-hydroxybutyl thiabicyclo[2,2,1]hept-5-ene-2-carboxylate/t-butyl 5-norbornene-2-carboxylate/maleic anhydride) polymer;

poly(3-hydroxybutyl thiabicyclo[2,2,1]hept-5-ene-2-carboxylate/t-butyl 5-norbornene-2-carboxylate/maleic anhydride) polymer;

poly(2-hydroxybutyl thiabicyclo[2,2,1]hept-5-ene-2-carboxylate/t-butyl 5-norbornene-2-carboxylate/maleic anhydride) polymer; and poly(2-methyl-3-hydroxypropyl thiabicyclo[2,2,1]hept-5-ene-2-carboxylate/t-butyl 5-norbornene-2-carboxylate/maleic anhydride) polymer.

Polymers of the present invention can be prepared by a conventional polymerization process such as bulk polymerization or solution polymerization. For example, one or more of t-butyl 5-norbornene-2-carboxylate, 5-norbornene-2-carboxylic acid, and 5-norbornene-2,3-dicarboxylic acid may be dissolved in an organic solvent along with a heterobicyclic compound of the present invention and maleic anhydride. The polymerization initiator is added thereto, and the resultant solution is reacted at a temperature between 60° C. to 90° C., in a nitrogen or an argon atmosphere, for 4 to 20 hours. After the polymerization reaction is complete, the polymer can precipitated using ethyl ether, then dried in a vacuum to obtain the polymer. Typical solvents used in the polymerization process include tetrahydrofuran, toluene, benzene, methyl ethyl ketone, dioxane, and the like. Typical polymerization initiators include 2,2-azobisisobutyronitrile (AIBN), acetyl peroxide, lauryl peroxide, t-butyl peroxide, di-t-butyl peroxide, and the like.

The polymers of the present invention may be prepared by polymerization with only the heterobicyclic compound of formula 1 using known polymerization methods, for example using a metal catalyst system as described in Goodall et al, International Publication Number WO 96/37526, which is incorporated herein by reference in its entirety. However, the preferred polymerization method for the practice of the present invention is to incorporate one or more additional monomers (hereinafter referred to as the polymerization-enhancing comonomers) to increase the yield of polymer. The most preferred polymerization-enhancing comonomers include, but are not limited to, maleic anhydride.

Another aspect of the present invention provides a photoresist composition comprising a polymer of Formula 2, a photo acid generator, and an organic solvent. In the method of forming a photoresist pattern on a semiconductor device, the amount of the photoresist polymer resin used varies with the organic solvent, the photo acid generator, and the conditions of the lithography process, but the photoresist resin is generally used in an amount equal to about 10 to 30 wt % of the organic solvent used in the photoresist solution.

In the practice of the present invention, the photo acid generator comprises sulfur salts or onium salts, for example, triphenylsulfonium triflate, dibutylnaphthyl sulfonium triflate, 2,6-dimethyl sulfonate, bis(arylsulforyl)-diazomethane, oximsulfonate, 1,2-diazonaphtoqinone-4-sulfonate, and the like. The photo acid generator used is approximately 0.05 to 10 wt % of the photoresist polymer used in the photoresist solution. The photo sensitivity is generally insufficient at amounts of photo acid generator below 0.05 wt %. Because the photo acid generator absorbs too much of the ultra-violet rays, typically patterns having poor profiles are formed at over 20 wt %.

Exemplary organic solvents which are useful in photoresist composition of the present invention include, but are not limited to, ethyl 3-ethoxypropionate, methyl 3-methoxypropionate, cyclohexanone, propylenglycol, methyl ether acetate, and the like. To obtain a photoresist layer having a desirable thickness, the solvent is preferably 200 to 1000 wt % of the photoresist resin. For example, it has been found that a satisfactory photoresist layer having a thickness of 0.5 $\mu$m can be formed when the solvent used is 600 wt % of the photoresist resin.

The photoresist solution of the present invention can be used in the conventional manner, i.e., it can be spin-coated on a silicon wafer, baked, then exposed to a laser exposer and once more baked, and then developed in the tetramethyl ammonium hydroxide solution. As a result, the desired photoresist micro pattern is formed on the wafer. Suitable light sources used for exposing the wafer include ArF, KrF, EUV(extreme ultraviolet), an electron beam, an ion beam, and the like. Accordingly, the photoresist resins containing the oxabicyclo monomers of the present invention may be used in the ultra-violet regions of the light spectrum.

A better understanding of the present invention may be obtained from the following examples which are set forth to illustrate, but to limit, the present invention.

PREPARATION EXAMPLE 1

Synthesis of 2-hydroxy ethyl oxabicyclo[2,2,1]hept-5-ene-2-carboxylate

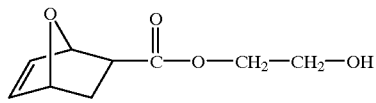

(7)

In a reactor, furan (1 mol) was dissolved in a tetrahydrofuran solvent (500 g), and the solution was cooled to a temperature of −30° C. Thereto, 2-hydroxyethyl acrylate(1 mol) was slowly added while the temperature of the solution remained at −30° C. The resultant solution was reacted for 10 hours while stirring at a temperature of −30° C. After the reaction was completed, the solution was reacted for 10 more hours while the temperature of the solution gradually ascended to 70° C. After the reaction was completed, the solvent was removed by a rotary evaporator, and the resultant was distilled at a reduced pressure. The pure 2-hydroxy ethyl oxabicyclo[2,2,1]hept-5-ene-2-carboxylate (147 g) was obtained. (yield: 80%, purity: 99.9%).

PREPARATION EXAMPLE 2

Synthesis of 3-hydroxypropyl oxabicyclo[2,2,1]hept-5-ene-2-carboxylate

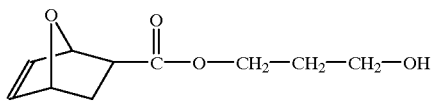

(8)

The same procedure described in Preparation Example 1 was repeated, but 3-hydroxypropyl acrylate (1 mol) was used instead of 2-hydroxyethyl acrylate to obtain 3-hydroxypropyl oxabicyclo[2,2,1]hept-5-ene-2-carboxylate (154 g). (yield: 78%, purity: 99%).

PREPARATION EXAMPLE 3

Synthesis of 2-hydroxypropyl oxabicyclo[2,2,1]hept-5-ene-2-carboxylate

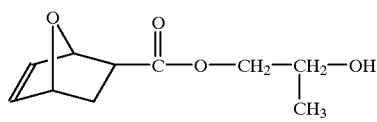

(9)

The same procedure described in Preparation Example 1 was repeated but 2-hydroxypropyl acrylate (1 mol) was used instead of 2-hydroxyethyl acrylate to obtain 2-hydroxypropyl oxabicyclo[2,2,1]hept-5-ene-2-carboxylate (139 g). (yield: 70%, purity: 99.9%).

PREPARATION EXAMPLE 4

Synthesis of 4-hydroxybutyl oxabicyclo[2,2,1]hept-5-ene-2-carboxylate

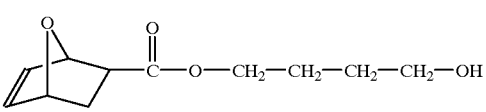

(10)

The same procedure described in Preparation Example 1 was repeated but 4-hydroxybutyl acrylate (1 mol) was used instead of 2-hydroxyethyl acrylate to obtain 4-hydroxybutyl oxabicyclo[2,2,1]hept-5-ene-2-carboxylate (170 g). (yield: 80%, purity: 99%).

PREPARATION EXAMPLE 5

Synthesis of 3-hydroxybutyl oxabicyclo[2,2,1]hept-5-ene-2-carboxylate

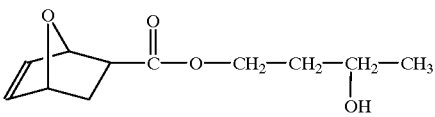

(11)

The same procedure described in Preparation Example 1 was repeated but 3-hydroxybutyl acrylate (1 mol) was used instead of 2-hydroxyethyl acrylate to obtain 3-hydroxybutyl oxabicyclo[2,2,1]hept-5-ene-2-carboxylate (166 g). (yield: 78%, purity: 99.1%).

PREPARATION EXAMPLE 6

Synthesis of 2-hydroxybutyl oxabicyclo[2,2,1]hept-5-ene-2-carboxylate

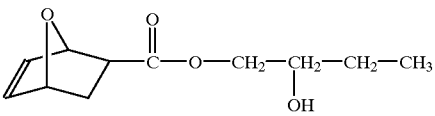

(12)

The same procedure described in Preparation Example 1 was repeated but 2-hydroxybutyl acrylate (1 mol) was used instead of 2-hydroxyethyl acrylate to obtain 2-hydroxybutyl oxabicyclo[2,2,1]hept-5-ene-2-carboxylate (153 g). (yield: 72%, purity: 98.9%).

PREPARATION EXAMPLE 7

Synthesis of 2-methyl-3-hydroxypropyl oxabicyclo[2,2,1]hept-5-ene-2-carboxylate

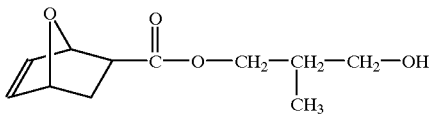

(13)

The same procedure described in Preparation Example 1 was repeated but 2-methyl-3-hydroxypropyl acrylate (1 mol) was used instead of 2-hydroxyethyl acrylate to obtain 2-methyl-3-hydroxypropyl oxabicyclo[2,2,1]hept-5-ene-2-carboxylate (149 g). (yield: 70%, purity: 98%).

PREPARATION EXAMPLE 8

Synthesis of poly(2-hydroxyethyl oxabicyclo[2,2,1]hept-5-ene-2-carboxylate/t-butyl 5-norbornene-2-carboxylate/5-norbornene-2-carboxylic acid/maleic anhydride) polymer

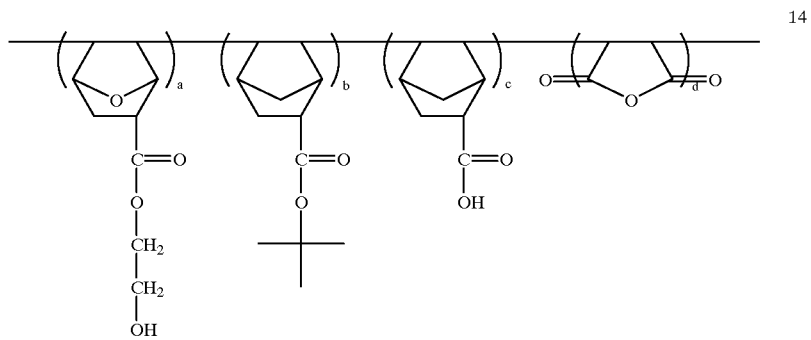

14

2-hydroxyethyl oxabicyclo[2,2,1]hept-5-ene-2-carboxylate (0.1 mol), t-butyl 5-norbornene-2-carboxylate (0.85 mol), 5-norbornene-2-carboxylic acid (0.05 mol) and maleic anhydride (1 mol) were dissolved in tetrahydrofuran solvent (200 g). Thereto, 2,2-azobisisobutyonitrile (5.84 g) was added, and the solution was mixed. The solution was polymerized at a temperature of 67° C. in a nitrogen atmosphere for 10 hours. After the polymerization reaction was completed, the polymer was precipitated in an ethyl ether solvent, then was dried in a vacuum to obtain the pure title polymer (89.4 g) having a molecular weight of approximately 6700. (yield: 31%, purity: 99.9%).

PREPARATION EXAMPLE 9

Synthesis of poly(3-hydroxypropyl oxabicyclo[2,2,1]hept-5-ene-2-carboxylate/t-butyl 5-norbornene-2-carboxylate/5-norbornene-2-carboxylic acid/maleic anhydride) polymer

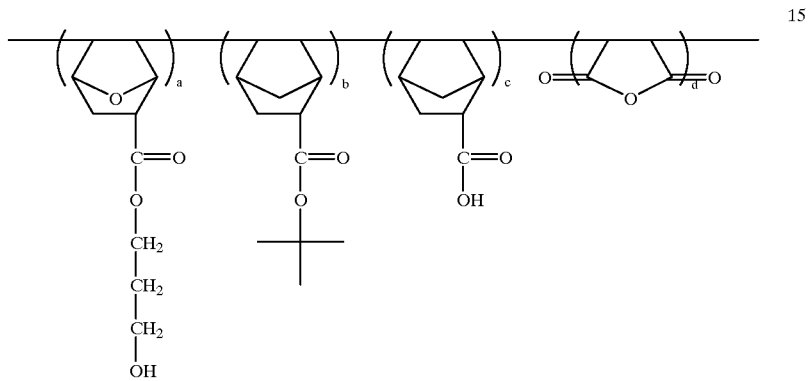

15

The same procedure described in Preparation Example 8 was repeated but 3-hydroxypropyl oxabicyclo[2,2,1]hept-5-ene-2-carboxylic acid (19.43 g) was used instead of 2-hydroxyethyl oxabicyclo[2,2,1]hept-5-ene-2-carboxylic acid to obtain the pure title polymer (91.32 g) having a molecular weight of approximately 7200. (yield: 31.5%, purity: 99.9%).

PREPARATION EXAMPLE 10

Synthesis of poly(2-hydroxypropyl oxabicyclo[2,2,1]hept-5-ene-2-carboxylate/t-butyl 5-norbornene-2-carboxylate/5-norbornene-2-carboxylic acid/maleic anhydride)

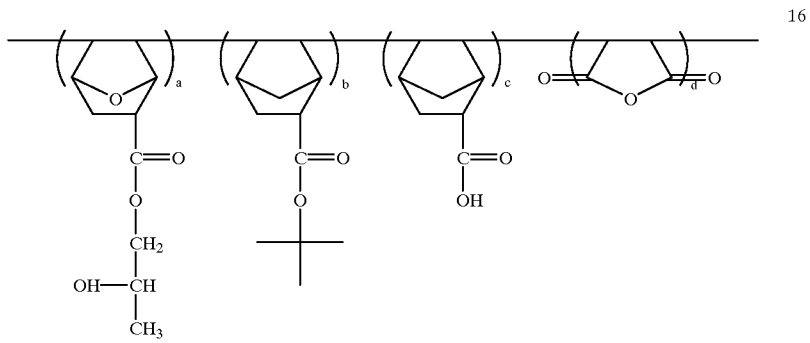

16

The same procedure described in Preparation Example 8 was repeated but 2-hydroxypropyl oxabicyclo[2,2,1]hept-5-ene-2-carboxylic acid (19.43 g) was used instead of 2-hydroxyethyl oxabicyclo[2,2,1]hept-5-ene-2-carboxylic acid to obtain the pure title polymer (86.68 g) having a molecular weight of approximately 6112. (yield: 29%, purity: 99.9%).

PREPARATION EXAMPLE 11

Synthesis of poly(4-hydroxybutyl oxabicyclo[2,2,1]hept-5-ene-2-carboxylate/t-butyl 5-norbornene-2-carboxylate/5-norbornene-2-carboxylic acid/maleic anhydride) polymer

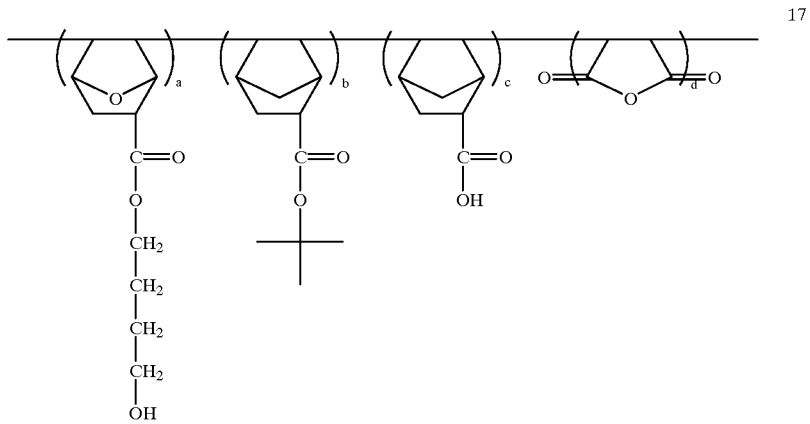

17

The same procedure described in Preparation Example 8 was repeated but 4-hydroxybutyl oxabicyclo[2,2,1]hept-5-ene-2-carboxylic acid (21.22 g) was used instead of 2-hydroxyethyl oxabicyclo[2,2,1]hept-5-ene-2-carboxylic acid to obtain the pure title polymer (87.39 g) having a molecular weight of approximately 5700. (yield: 30%, purity: 99.9%).

PREPARATION EXAMPLE 12

Synthesis of poly(3-hydroxybutyl oxabicyclo[2,2,1]hept-5-ene-2-carboxylate/t-butyl 5-norbornene-2-carboxylate/5-norbornene-2-carboxylic acid/maleic anhydride) polymer

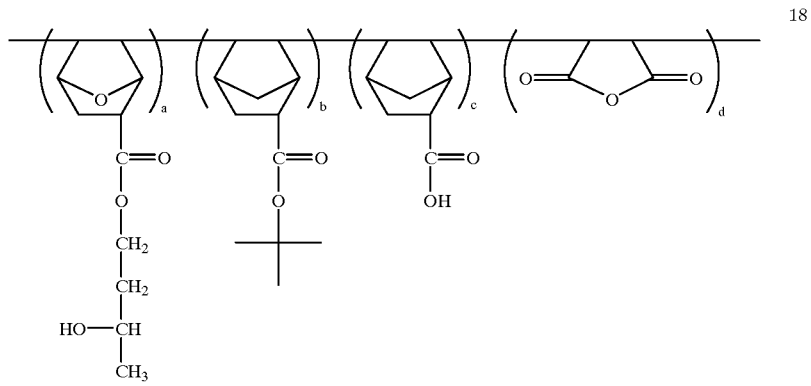

The same procedure described in Preparation Example 8 was repeated but 3-hydroxybutyl oxabicyclo[2,2,1]hept-5-ene-2-carboxylic acid (21.22 g) was used instead of 2-hydroxyethyl oxabicyclo[2,2,1]hept-5-ene-2-carboxylic acid to obtain the pure title polymer (87.3 g) having a molecular weight of approximately 5820. (yield: 30%, purity: 99.9%).

PREPARATION EXAMPLE 13

Synthesis of poly(2-hydroxybutyl oxabicyclo[2,2,1]hept-5-ene-2-carboxylate/t-butyl 5-norbornene-2-carboxylate/5-norbornene-2-carboxylic acid/maleic anhydride) polymer

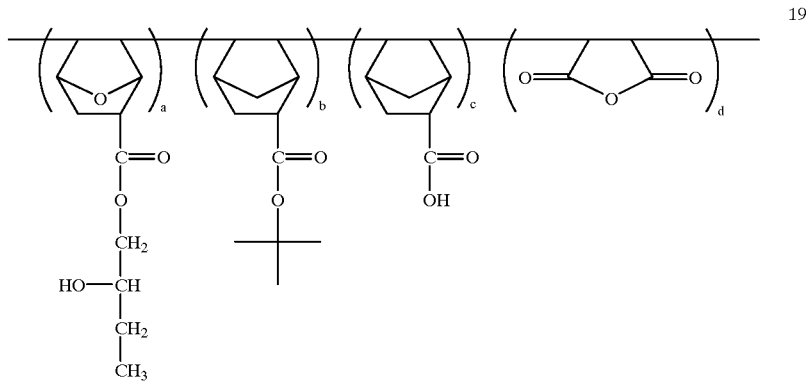

The same procedure described in Preparation Example 8 was repeated but 2-hydroxybutyl oxabicyclo[2,2,1]hept-5-ene-2-carboxylic acid (21.22 g) was used instead of 2-hydroxyethyl oxabicyclo[2,2,1]hept-5-ene-2-carboxylic acid to obtain the pure title polymer (78.65 g) having a molecular weight of approximately 6110. (yield: 27%, purity: 99.9%).

PREPARATION EXAMPLE 14

Synthesis of poly(2-methyl-3-hydroxypropyl oxabicyclo[2,2,1]hept-5-ene-2-carboxylate/t-butyl 5-norbornene-2-carboxylate/5-norbornene-2-carboxylic acid/maleic anhydride) polymer

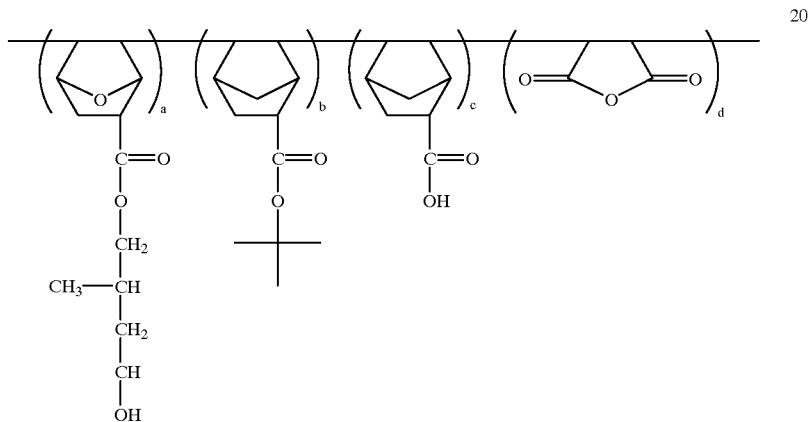

The same procedure described in Preparation Example 8 was repeated but 2-methyl-3-hydroxypropyl oxabicyclo[2,2,1]hept-5-ene-2-carboxylic acid (21.22 g) was used instead of 2-hydroxyethyl oxabicyclo[2,2,1]hept-5-ene-2-carboxylic acid to obtain the pure title polymer (84.48 g) having a molecular weight of approximately 6320. (yield: 29%, purity: 99.9%).

PREPARATION EXAMPLE 15

Synthesis of poly(2-hydroxyethyl oxabicyclo[2,2,1]hept-5-ene-2-carboxylate/t-butyl 5-norbornene-2-carboxylate/5-norbornene-2,3-dicarboxylic acid/maleic anhydride) polymer

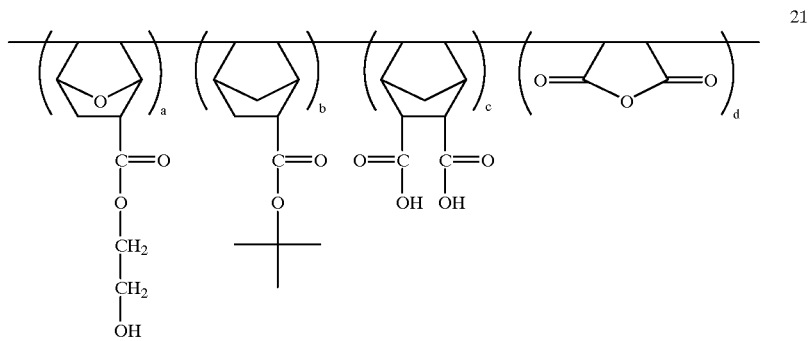

2-hydroxyethyl oxabicyclo[2,2,1]hept-5-ene-2-carboxylate (0.1 mol), t-butyl 5-norbornene-2-carboxylate (0.85 mol), 5-norbornene-2,3-dicarboxylic acid (0.05 mol) and maleic anhydride (1 mol) were dissolved in a tetrahydrofuran solvent (200 g). 2,2-azobisisobutyonitrile (5.84 g) was added, and the solution was mixed. The solution was polymerized at a temperature of 67° C. in a nitrogen atmosphere for 10 hours. After the polymerization reaction was completed, the polymer was precipitated in an ethyl ether solvent, then dried in a vacuum to obtain the pure title polymer (87.627 g). (yield: 30%, purity: 99.9%).

PREPARATION EXAMPLE 16

Synthesis of poly(3-hydroxypropyl oxabicyclo[2,2,1]hept-5-ene-2-carboxylate/t-butyl 5-norbornene-2-carboxylate/5-norbornene-2,3-dicarboxylic acid/maleic anhydride) polymer

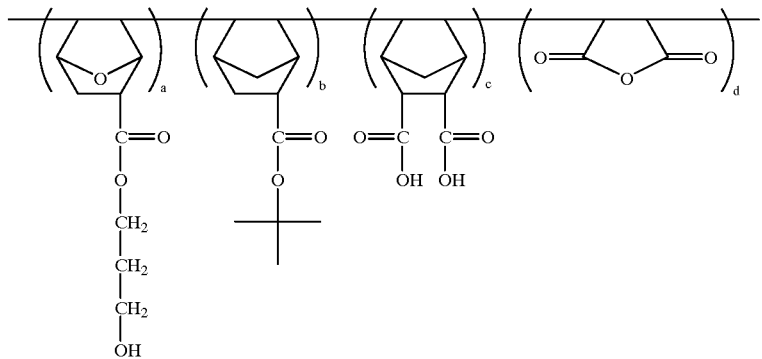

The same procedure described in Preparation Example 15 was repeated but 3-hydroxypropyl oxabicyclo[2,2,1]hept-5-ene-2-carboxylic acid (19.82 g) was used instead of 2-hydroxyethyl oxabicyclo[2,2,1]hept-5-ene-2-carboxylic acid to obtain the pure title polymer (92.1 g). (yield: 31.5%, purity: 99.9%).

PREPARATION EXAMPLE 17

Synthesis of poly(2-hydroxypropyl oxabicyclo[2,2,1]hept-5-ene-2-carboxylate/t-butyl 5-norbornene-2-carboxylate/5-norbornene-2,3-dicarboxylic acid/maleic anhydride) polymer

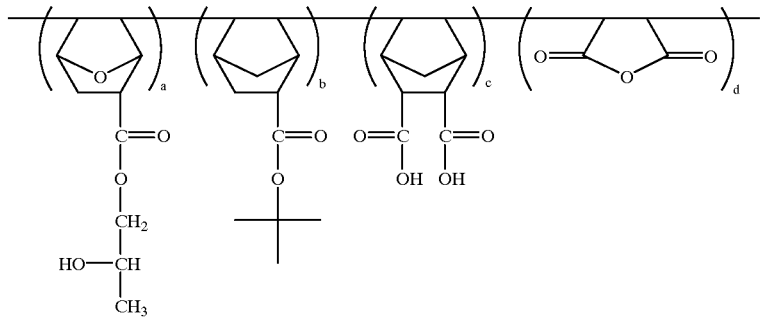

The same procedure described in Preparation Example 15 was repeated but 2-hydroxypropyl oxabicyclo[2,2,1]hept-5-ene-2-carboxylic acid (19.82 g) was used instead of 2-hydroxyethyl oxabicyclo[2,2,1]hept-5-ene-2-carboxylic acid to obtain the pure title polymer (92.08 g). (yield: 31.5%, purity: 99.9%).

PREPARATION EXAMPLE 18

Synthesis of poly(4-hydroxybutyl oxabicyclo[2,2,1]hept-5-ene-2-carboxylate/t-butyl 5-norbornene-2-carboxylate/5-norbornene-2,3-dicarboxylic acid/maleic anhydride) polymer

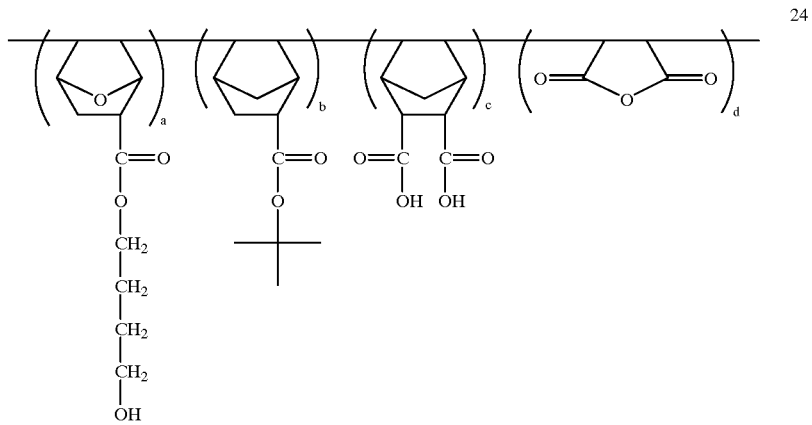

24

The same procedure described in Preparation Example 15 was repeated but 4-hydroxybutyl oxabicyclo[2,2,1]hept-5-ene-2-carboxylic acid (21.22 g) was used instead of 2-hydroxyethyl oxabicyclo[2,2,1]hept-5-ene-2-carboxylic acid to obtain the pure title polymer (76.37 g). (yield: 26%, purity: 99.9%).

PREPARATION EXAMPLE 19

Synthesis of poly(3-hydroxybutyl oxabicyclo[2,2,1]hept-5-ene-2-carboxylate/t-butyl 5-norbornene-2-carboxylate/5-norbornene-2,3-dicarboxylic acid/maleic anhydride) polymer

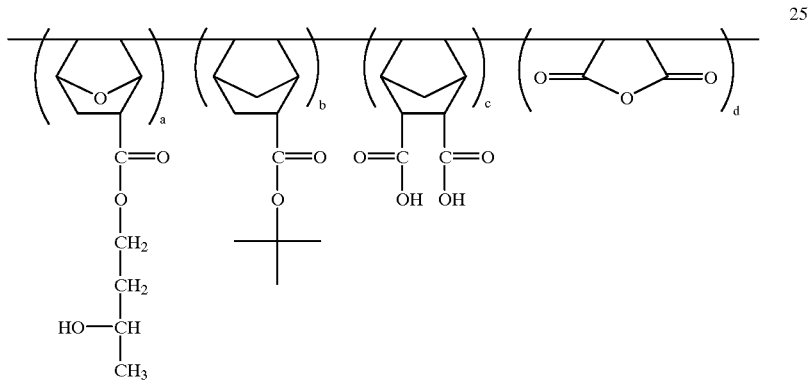

25

The same procedure described in Preparation Example 15 was repeated but 3-hydroxybutyl oxabicyclo[2,2,1]hept-5-ene-2-carboxylic acid (21.22 g) was used instead of 2-hydroxyethyl oxabicyclo[2,2,1]hept-5-ene-2-carboxylic acid to obtain the pure title polymer (67.55 g). (yield: 23%, purity: 99.9%).

PREPARATION EXAMPLE 20

Synthesis of poly(2-hydroxybutyl oxabicyclo[2,2,1]hept-5-ene-2-carboxylate/t-butyl 5-norbornene-2-carboxylate/5-norbornene-2,3-dicarboxylic acid/maleic anhydride) polymer

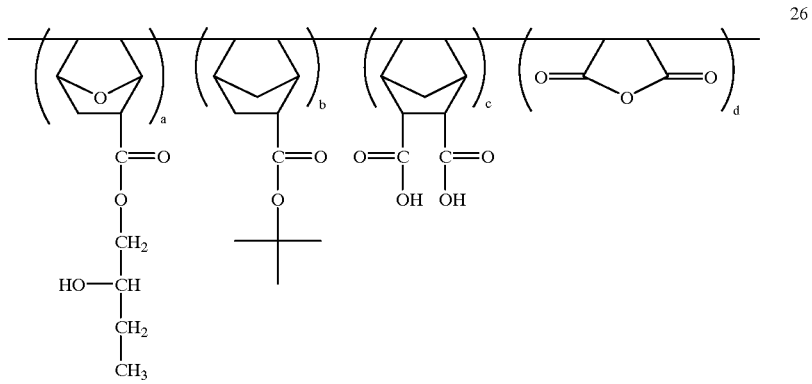

The same procedure described in Preparation Example 15 was repeated but 2-hydroxybutyl oxabicyclo[2,2,1]hept-5-ene-2-carboxylic acid (21.22 g) was used instead of 2-hydroxyethyl oxabicyclo[2,2,1]hept-5-ene-2-carboxylic acid to obtain the pure title polymer (73.43 g). (yield: 25%, purity: 99.9%).

PREPARATION EXAMPLE 21

Synthesis of poly(2-methyl-3-hydroxypropyl oxabicyclo[2,2,1]hept-5-ene-2-carboxylate/t-butyl 5-norbornene-2-carboxylate/5-norbornene-2,3-dicarboxylic acid/maleic anhydride) polymer

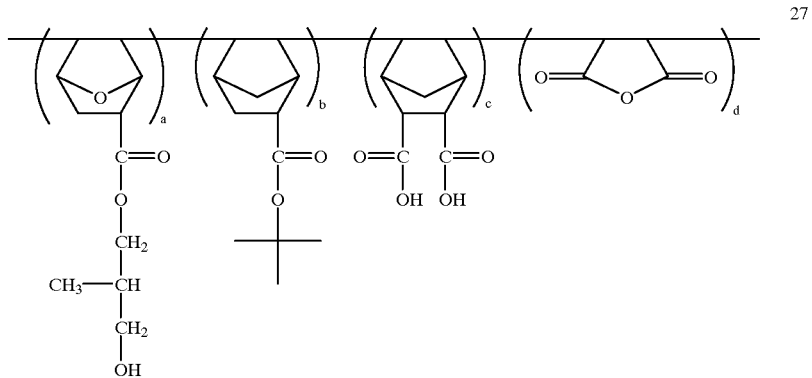

The same procedure described in Preparation Example 15 was repeated but 2-methyl-3-hydroxypropyl oxabicyclo[2,2,1]hept-5-ene-2-carboxylic acid (21.22 g) was used instead of 2-hydroxyethyl oxabicyclo[2,2,1]hept-5-ene-2-carboxylic acid to obtain the pure title polymer (88.11 g). (yield: 30%, purity: 99.9%).

PREPARATION EXAMPLE 22

Synthesis of poly(2-hydroxyethyl oxabicyclo[2,2,1]hept-5-ene-2-carboxylate/t-butyl 5-norbornene-2-carboxylate/maleic anhydride) polymer

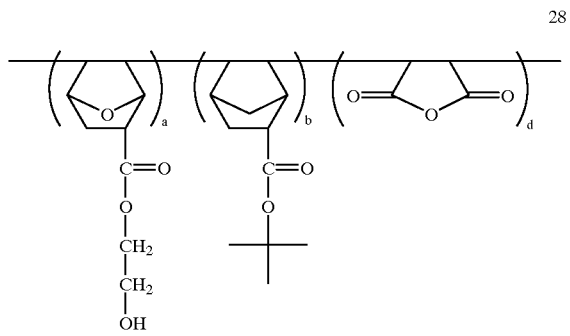

28

2-hydroxyethyl oxabicyclo[2,2,1]hept-5-ene-2-carboxylate (0.15 mol), t-butyl 5-norbornene-2-carboxylate (0.85 mol), and maleic anhydride (1 mol) were dissolved in a tetrahydrofuran solvent. 2,2-azobisisobutyonitrile (5.84 g) was added, and the solution was mixed. The solution was polymerized at a temperature of 67° C. in a nitrogen atmosphere for 10 hours. After the polymerization reaction was completed, the polymer was precipitated in an ethyl ether solvent, then dried in a vacuum to obtain the pure title polymer (63.94 g). (yield: 22%, purity: 99.9%).

PREPARATION EXAMPLE 23

Synthesis of poly(3-hydroxypropyl oxabicyclo[2,2,1]hept-5-ene-2-carboxylate/t-butyl 5-norbornene-2-carboxylate/maleic anhydride) polymer

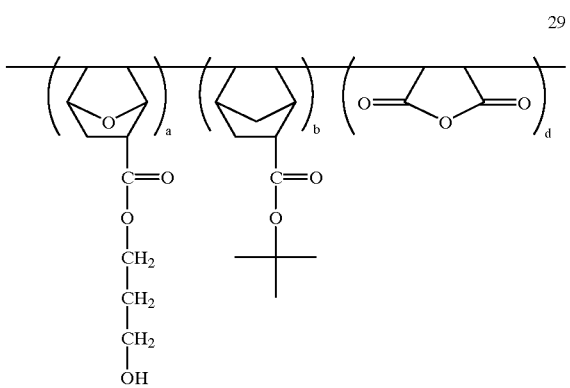

29

The same procedure described in Preparation Example 22 was repeated but 3-hydroxypropyl oxabicyclo[2,2,1]hept-5-ene-2-carboxylic acid (29.37 g) was used instead of 2-hydroxyethyl oxabicyclo[2,2,1]hept-5-ene-2-carboxylic acid to obtain the pure title polymer (73.18 g). (yield: 25%, purity: 99.9%).

PREPARATION EXAMPLE 24

Synthesis of poly(2-hydroxypropyl oxabicyclo[2,2,1]hept-5-ene-2-carboxylate/t-butyl 5-norbornene-2-carboxylate/maleic anhydride) polymer

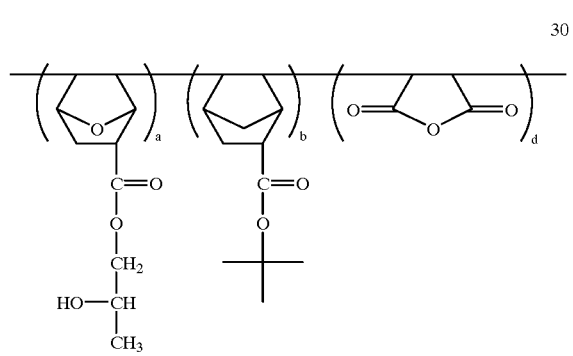

30

The same procedure described in Preparation Example 22 was repeated but 2-hydroxypropyl oxabicyclo[2,2,1]hept-5-ene-2-carboxylic acid (29.37 g) was used instead of 2-hydroxyethyl oxabicyclo[2,2,1]hept-5-ene-2-carboxylic acid to obtain the pure title polymer (76.1 g). (yield: 26%, purity: 99.9%).

PREPARATION EXAMPLE 25

Synthesis of poly(4-hydroxybutyl oxabicyclo[2,2,1]hept-5-ene-2-carboxylate/t-butyl 5-norbornene-2-carboxylate/maleic anhydride) polymer

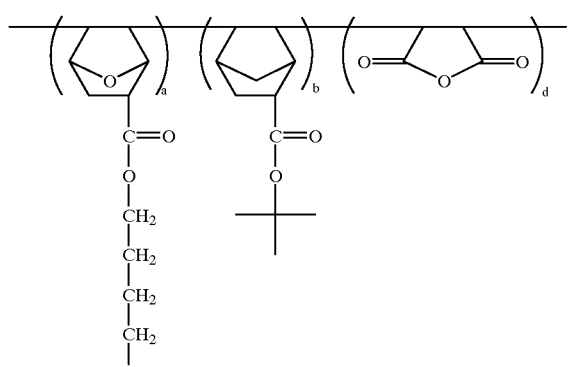

31

The same procedure described in Preparation Example 22 was repeated but 4-hydroxybutyl oxabicyclo[2,2,1]hept-5-ene-2-carboxylic acid (31.83 g) was used instead of 2-hydroxyethyl oxabicyclo[2,2,1]hept-5-ene-2-carboxylic acid to obtain the pure title polymer (67.82 g). (yield: 23%, purity: 99.9%).

PREPARATION EXAMPLE 26

Synthesis of poly(3-hydroxybutyl oxabicyclo[2,2,1] hept-5-ene-2-carboxylate/t-butyl 5-norbornene-2-carboxylate/maleic anhydride) polymer

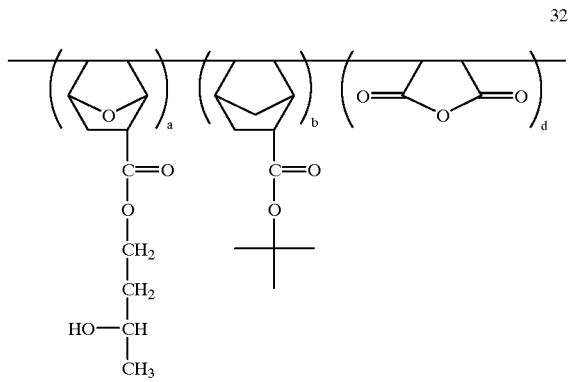

The same procedure described in Preparation Example 22 was repeated but 3-hydroxybutyl oxabicyclo[2,2,1]hept-5-ene-2-carboxylic acid (31.83 g) was used instead of 2-hydroxyethyl oxabicyclo[2,2,1]hept-5-ene-2-carboxylic acid to obtain the pure title polymer (67.82 g). (yield: 23%, purity: 99.9%).

PREPARATION EXAMPLE 27

Synthesis of poly(2-hydroxybutyl oxabicyclo[2,2,1] hept-5-ene-2-carboxylate/t-butyl 5-norbornene-2-carboxylate/maleic anhydride) polymer

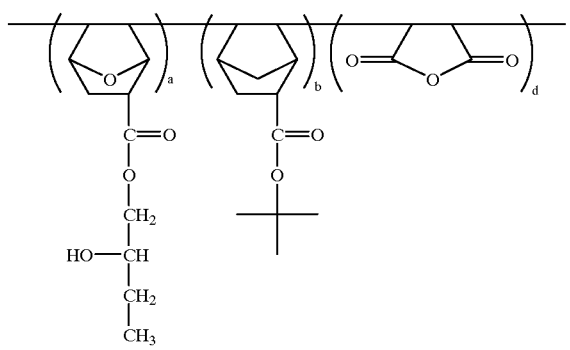

The same procedure described in Preparation Example 22 was repeated but 2-hydroxybutyl oxabicyclo[2,2,1]hept-5-ene-2-carboxylic acid (31.83 g) was used instead of 2-hydroxyethyl oxabicyclo[2,2,1]hept-5-ene-2-carboxylic acid to obtain the pure title polymer (70.7 g). (yield: 24%, purity: 99.9%).

PREPARATION EXAMPLE 28

Synthesis of poly(2-methyl-3-hydroxypropyl oxabicyclo[2,2,1]hept-5-ene-2-carboxylate/t-butyl 5-norbornene-2-carboxylate/maleic anhydride) polymer

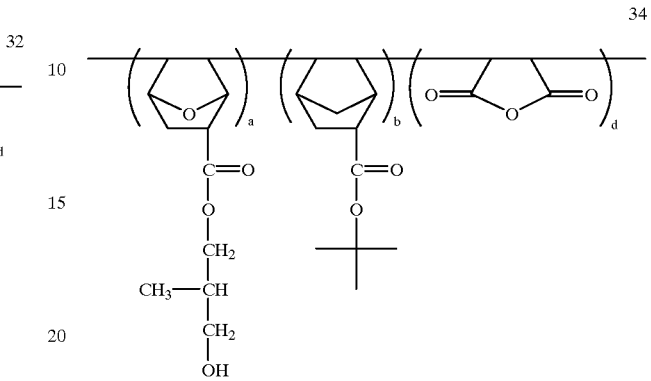

The same procedure described in Preparation Example 22 was repeated but 2-methyl-3-hydroxypropyl oxabicyclo[2,2,1]hept-5-ene-2-carboxylic acid (31.83 g) was used instead of 2-hydroxyethyl oxabicyclo[2,2,1]hept-5-ene-2-carboxylic acid to obtain the pure title polymer (61.92 g). (yield: 21%, purity: 99.9%).

PREPARATION EXAMPLE 29–57

Preparation Examples of 1–28 can be repeated using thiofuran instead of furan to obtain a corresponding thiabicyclic compounds or polymers.

EXAMPLE 1

The poly(2-hydroxyethyl oxabicyclo[2,2,1]hept-5-ene-2-carboxylate/t-butyl 5-norbornene-2-carboxylate/5-norbornene-2-carboxylic acid/maleic anhydride) polymer (10 g) obtained in Preparation Example 8 and triphenyl sulfonium triflate (0.12 g) were dissolved in ethyl 3-ethoxypropionate solvent (50 g), then filtered through a 0.10 μm filter to obtain a photoresist solution. The photoresist solution was spin-coated on a silicon wafer, and the wafer was baked at 110° C. for 90 seconds. Thereafter, the wafer was over-coated to prevent an amine contamination, and baked once more. After the baking process, the wafer was exposed to an ArF laser exposer, and then baked at 110° C. for 90 seconds. When the baking process was completed, the wafer was developed in 2.38 wt % tetramethylammonium hydroxide for 40 seconds. As a result, a pattern of 0.13 μm L/S was obtained (cf. FIG. 2). In addition to ArF, other exposing light sources can include KrF, an E-beam, EUV (extreme ultraviolet), an electron beam, an ion beam, and the like.

EXAMPLE 2

The same procedure described in Example 1 was repeated except using the poly(3-hydroxypropyl oxabicyclo [2,2,1] hept-5-ene-2-carboxylate/t-butyl 5-norbornene-2-carboxylate/5-norbornene-2-carboxylic acid/maleic anhydride) polymer (10 g) prepared in Preparation Example 9, to obtain a 0.14 μm L/S pattern (cf. FIG. 3).

EXAMPLE 3

The same procedure described in Example 1 was repeated except using the poly(2-hydroxypropyl oxabicyclo[2,2,1]

hept-5-ene-2-carboxylate/t-butyl 5-norbornene-2-carboxylate/5-norbornene-2-carboxylic acid/maleic anhydride) polymer (14 g) prepared in Preparation Example 10, to obtain a 0.14 μm L/S pattern (cf. FIG. 4).

EXAMPLE 4

The same procedure described in Example 1 was repeated except using the poly(4-hydroxybutyl oxabicyclo[2,2,1]hept-5-ene-2-carboxylate/t-butyl 5-norbornene-2-carboxylate/5-norbornene-2-carboxylic acid/maleic anhydride) polymer (9 g) prepared in Preparation Example 11, to obtain a 0.14 μm L/S pattern (cf. FIG. 5).

EXAMPLE 5

The same procedure described in Example 1 was repeated except using the poly(3-hydroxybutyl oxabicyclo [2,2,1]hept-5-ene-2-carboxylate/t-butyl 5-norbornene-2-carboxylate/5-norbornene-2-carboxylic acid/maleic anhydride) polymer (10 g) prepared in Preparation Example 12, to obtain a 0.14 μm L/S pattern (cf FIG. 6).

EXAMPLE 6

The same procedure described in Example 1 was repeated except using the poly(2-hydroxybutyl oxabicyclo[2,2,1]hept-5-ene-2-carboxylate/t-butyl 5-norbornene-2-carboxylate/5-norbornene-2-carboxylic acid/maleic anhydride) polymer (7 g) prepared in Preparation Example 13, to obtain a 0.14 μm L/S pattern (cf. FIG. 7).

EXAMPLE 7

The same procedure described in Example 1 was repeated except using the poly(2-hydroxyethyl oxabicyclo[2,2,1]hept-5-ene-2-carboxylate/t-butyl 5-norbornene-2-carboxylate/5-norbornene-2,3-dicarboxylic acid/maleic anhydride) polymer (9 g) prepared in Preparation Example 15, to obtain a 0.13 μm L/S pattern (cf. FIG. 8).

EXAMPLE 8

The same procedure described in Example 1 was repeated except using the poly(3-hydroxypropyl oxabicyclo[2,2,1]hept-5-ene-2-carboxylate/t-butyl 5-norbornene-2-carboxylate/5-norbornene-2,3-dicarboxylic acid/maleic anhydride) polymer (8 g) prepared in Preparation Example 16, to obtain a 0.13 μm L/S pattern (cf. FIG. 9).

EXAMPLE 9

The same procedure described in Example 1 was repeated except using the poly(2-hydroxypropyl oxabicyclo[2,21]hept-5-ene-2-carboxylate/t-butyl 5-norbornene-2-carboxylate/5-norbornene-2,3-dicarboxylic acid/maleic anhydride) polymer (8 g) prepared in Preparation Example 17, to obtain a 0.13 μm L/S pattern (cf. FIG. 10).

EXAMPLE 10

The same procedure described in Example 1 was repeated except using the poly(4-hydroxybutyl oxabicyclo[2,2,1]hept-5-ene-2-carboxylate/t-butyl 5-norbornene-2-carboxylate/5-norbornene-2,3-dicarboxylic acid/maleic anhydride) polymer (12 g) prepared in Preparation Example 18, to obtain a 0.14 μm L/S pattern (cf FIG. 11).

EXAMPLE 11

The same procedure described in Example 1 was repeated except using the poly(3-hydroxybutyl oxabicyclo[2,2,1]hept-5-ene-2-carboxylate/t-butyl 5-norbornene-2-carboxylate/5-norbornene-2,3-dicarboxylic acid/maleic anhydride) polymer (8 g) prepared in Preparation Example 19, to obtain a 0.14 μm L/S pattern (cf. FIG. 12).

EXAMPLE 12

The same procedure described in Example 1 was repeated except using the poly(2-hydroxyethyl oxabicyclo[2,2,1]hept-5-ene-2-carboxylate/t-butyl 5-norbornene-2-carboxylate/maleic anhydride) polymer (10 g) prepared in Preparation Example 22, to obtain a 0.14 μm L/S pattern (cf. FIG. 13).

EXAMPLE 13

The same procedure described in Example 1 was repeated except using the poly(3-hydroxypropyl oxabicyclo[2,2,1]hept-5-ene-2-carboxylate/t-butyl 5-norbornene-2-carboxylate/maleic anhydride) polymer (9 g) prepared in Preparation Example 23, to obtain a 0.14 μm L/S pattern (cf. FIG. 14).

EXAMPLE 14

The same procedure described in Example 1 was repeated except using the poly(2-hydroxypropyl oxabicyclo[2,2,1]hept-5-ene-2-carboxylate/t-butyl 5-norbornene-2-carboxylate/maleic anhydride) polymer (9 g) prepared in Preparation Example 24, to obtain a 0.13μm L/S pattern (cf FIG. 15).

EXAMPLE 15

The same procedure described in Example 1 was repeated except using the poly(4-hydroxybutyl oxabicyclo[2,2,1]hept-5-ene-2-carboxylate/t-butyl 5-norbornene-2-carboxylate/maleic anhydride) polymer (8 g) prepared in Preparation Example 25, to obtain a 0.13 μm L/S pattern (cf. FIG. 16).

EXAMPLE 16

The same procedure described in Example 1 was repeated except using the poly(3-hydroxybutyl oxabicyclo[2,2,1]hept-5-ene-2-carboxylate/t-butyl 5-norbornene-2-carboxylate/maleic anhydride) polymer (13 g) prepared in Preparation Example 26, to obtain a 0.14 μm L/S pattern (cf. FIG. 17).

As described above, the oxabicyclo compounds of the present invention may be effectively used as monomers for manufacturing photoresist resins for ArF, KrF, EUV, an electron beam, or ion beam lithography processes, which can be used to produce a high density micro pattern of less than 0.15 μm(DRAM over 1G). The photoresist resins containing the oxabicyclo monomer have good etching resistance, and do not allow a pattern collapse due to the high adhesiveness of the photoresist. Also, the oxabicyclo compounds have a high purity and low cost, and can therefore provide photoresist resins having such superior properties which can be mass-produced economically.

What is claimed is:

1. A photoresist polymer derived from a monomer comprising a compound of the formula:

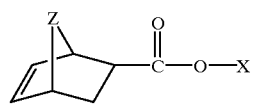

wherein
Z is S;
X is a moiety of the formula:

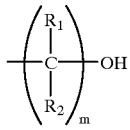

each of $R_1$ and $R_2$ is independently hydrogen or a $C_1$–$C_4$ substituted or unsubstituted straight or branched chain alkyl group; and
m is an integer from 1 to 4.

2. The photoresist polymer of claim 1, wherein said monomer further comprises a compound of the formula:

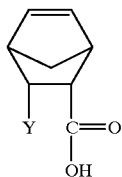

wherein
Y is hydrogen or a carboxylic acid group.

3. The photoresist polymer of claim 2, wherein said monomer further comprises maleic anhydride.

4. The photoresist polymer of claim 3, wherein said monomer further comprises tert-butyl 5-norbornene-2-carboxylate.

5. The photoresist polymer according to claim 1 of the formula:

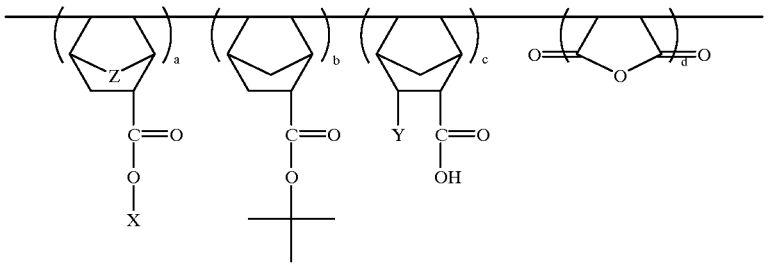

wherein, Z is S; X is 2-hydroxyethyl, 2-hydroxypropyl, 3-hydroxypropyl, 2-hydroxybutyl, 3-hydroxybutyl, 2-methyl-3-hydroxypropyl or 4-hydroxybutyl;
Y is a hydrogen or a carboxylic acid group; and
a, b, c and d are relative ratios of each monomers.

6. The photoresist polymer according to claim 5, wherein the ratio of a:b:c:d is (5–90 mole %):(10–90 mole %):(0–50 mole %) : (50–120 mole %).

7. The photoresist polymer according to claim 5, wherein the polymer is selected from the group consisting of:
poly(2-hydroxyethyl thiabicyclo[2,2,1]hept-5-ene-2-carboxylate/t-butyl 5-norbornene-2-carboxylate/5-norbornene-2-carboxylic acid/maleic anhydride) polymer;
poly(3-hydroxypropyl thiabicyclo[2,2,1]hept-5-ene-2-carboxylate/t-butyl 5-norbornene-2-carboxylate/5-norbornene-2-carboxylic acid/maleic anhydride) polymer;
poly(2-hydroxypropyl thiabicyclo[2,2,1]hept-5-ene-2-carboxylate/t-butyl 5-norbornene-2-carboxylate/5-norbornene-2-carboxylic acid/maleic anhydride) polymer;
poly(4-hydroxybutyl thiabicyclo[2,2,1]hept-5-ene-2-carboxylate/t-butyl 5-norbornene-2-carboxylate/5-norbornene-2-carboxylic acid/maleic anhydride) polymer;
poly(3-hydroxybutyl thiabicyclo[2,2,1]hept-5-ene-2-carboxylate/t-butyl 5-norbornene-2-carboxylate/5-norbornene-2-carboxylic acid/maleic anhydride) polymer;
poly(2-hydroxybutyl thiabicyclo[2,2,1]hept-5-ene-2-carboxylate/t-butyl 5-norbornene-2-carboxylate/5-norbornene-2-carboxylic acid/maleic anhydride) polymer;
poly(2-methyl-3-hydroxypropyl thiabicyclo[2,2,1]hept-5-ene-2-carboxylate/t-butyl 5-norbornene-2-carboxylate/5-norbornene-2-carboxylic acid/maleic anhydride) polymer;
poly(2-hydroxyethyl thiabicyclo[2,2,1]hept-5-ene-2-carboxylate/t-butyl 5-norbornene-2-carboxylate/5-norbornene-2,3-dicarboxylic acid/maleic anhydride) polymer;
poly(3-hydroxypropyl thiabicyclo[2,2,1]hept-5-ene-2-carboxylate/t-butyl 5-norbornene-2-carboxylate/5-norbornene-2,3-dicarboxylic acid/maleic anhydride) polymer;
poly(2-hydroxypropyl thiabicyclo[2,2,1]hept-5-ene-2-carboxylate/t-butyl 5-norbornene-2-carboxylate/5-norbornene-2,3-dicarboxylic acid/maleic anhydride) polymer;
poly(4-hydroxybutyl thiabicyclo[2,2,1]hept-5-ene-2-carboxylate/t-butyl 5-norbornene-2-carboxylate/5-norbornene-2,3-dicarboxylic acid/maleic anhydride) polymer;
poly(3-hydroxybutyl thiabicyclo[2,2,1]hept-5-ene-2-carboxylate/t-butyl 5-norbornene-2-carboxylate/5-norbornene-2,3-dicarboxylic acid/maleic anhydride) polymer;
poly(2-hydroxybutyl thiabicyclo[2,2,1]hept-5-ene-2-carboxylate/t-butyl 5-norbornene-2-carboxylate/5-norbornene-2,3-dicarboxylic acid/maleic anhydride) polymer;
poly(2-methyl-3-hydroxypropyl thiabicyclo[2,2,1]hept-5-ene-2-carboxylate/t-butyl 5-norbornene-2-carboxylate/5-norbornene-2,3-dicarboxylic acid/ maleic anhydride) polymer;
poly(2-hydroxyethyl thiabicyclo[2,2,1]hept-5-ene-2-carboxylate/t-butyl 5-norbornene-2-carboxylate/maleic anhydride) polymer;
poly(3-hydroxypropyl thiabicyclo[2,2,1]hept-5-ene-2-carboxylate/t-butyl 5-norbornene-2-carboxylate/maleic anhydride) polymer;
poly(2-hydroxypropyl thiabicyclo[2,2,1]hept-5-ene-2-carboxylate/t-butyl 5-norbornene-2-carboxylate/maleic anhydride) polymer;

poly(4-hydroxybutyl thiabicyclo[2,2,1]hept-5-ene-2-carboxylate/t-butyl 5-norbornene-2-carboxylate/maleic anhydride) polymer;

poly(3-hydroxybutyl thiabicyclo[2,2,1]hept-5-ene-2-carboxylate/t-butyl 5-norbornene-2-carboxylate/maleic anhydride) polymer;

poly(2-hydroxybutyl thiabicyclo[2,2,1]hept-5-ene-2-carboxylate/t-butyl 5-norbornene-2-carboxylate/maleic anhydride) polymer; and poly(2-methyl-3-hydroxypropyl thiabicyclo[2,2,1]hept-5-ene-2-carboxylate/t-butyl 5-norbornene-2,3-dicarboxylate/maleic anhydride) polymer.

8. A method of preparing a photoresist polymer of the formula:

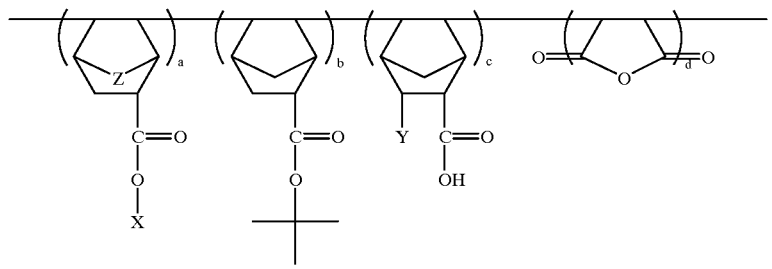

wherein

Z is S;

X is 2-hydroxyethyl, 2-hydroxypropyl, 3-hydroxypropyl, 2-hydroxybutyl, 3-hydroxybutyl, 2-methyl-3-hydroxypropyl or 4-hydroxybutyl;

Y is a hydrogen or a carboxylic acid group; and a, b, c and d are relative ratios of each monomeric units; said method comprising the steps of:

(a) admixing
   (i) one or more compounds selected from the group consisting of t-butyl 5-norbornene-2-carboxylate; 5-norbornene-2-carboxylic acid and 5-norbornene-2,3-dicarboxylic acid;
   (ii) maleic anhydride;
   (iii) a compound of the formula:

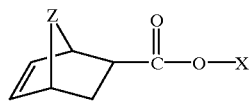

wherein

Z is S;

X is a moiety of the formula:

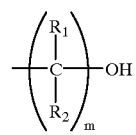

each of $R_1$ and $R_2$ is independently hydrogen or a $C_1$–$C_4$ substituted or unsubstituted straight or branched chain alkyl group; and m is an integer from 1 to 4; and
   (iv) a polymerization initiator; and (b) providing conditions sufficient to produce said photoresist polymer from said admixture of step (a).

9. The method of claim 8, wherein said polymerization initiator is 2,2-azobisisobutyronitrile, acetyl peroxide, lauryl peroxide, t-butyl peroxide, or di-t-butyl peroxide.

10. A photoresist composition comprising:

(a) said photoresist polymer of claim 1;

(b) a photo acid generator; and (c) an organic solvent.

11. The photoresist composition of claim 10, wherein the amount of said photoresist polymer is in the range of from about 10 to about 30 wt % of the amount of said organic solvent.

12. The photoresist composition of claim 10, wherein said photo acid generator is a sulfur salt or an onium salt.

13. The photoresist composition of claim 10, wherein said photo acid generator is triphenylsulfonium triflate, dibutylnaphtylsulfonium triflate, 2,6-dimethyl sulfonate, bis(arylsulfonyl)-diazomethan, oxime sulfonate, or 1,2-diazonaphtoquinone-4-sulfonate.

14. The photoresist composition of claim 10, wherein the amount of said photo acid generator is in the range from about 0.05 to about 10 wt % of the amount of said photoresist polymer.

15. The photoresist composition of claim 10, wherein said organic solvent is ethyl 3-ethoxy propionate, methyl 3-methoxy propionate, cyclohexanone, propylene glycol methyl ether acetate or a mixture thereof.

16. A method for forming a photoresist pattern, comprising the steps of:

(a) forming a photoresist film by coating the photoresist composition of claim 10 on a silicon wafer;

(b) exposing the coated photoresist film to light using an exposer; and (c) developing said exposed photoresist film.

17. The method of claim 16, wherein said exposer is ArF, KrF, EUV(extreme ultraviolet), an electron beam, an ion beam or an X-ray.

18. The method of claim 16 further comprising the steps of baking said photoresist film before and/or after said step (b).

19. The method of claim 16, wherein said step (c) comprises contacting said exposed photoresist film with a solution comprising tetramethylammonium hydroxide.

20. A semiconductor device manufactured by the method of claim 16.

* * * * *